(12) United States Patent
Yoshino et al.

(10) Patent No.: US 9,190,301 B2
(45) Date of Patent: Nov. 17, 2015

(54) WAFER SEPARATING APPARATUS AND WAFER SEPARATING METHOD

(71) Applicant: Panasonic Corporation, Osaka (JP)

(72) Inventors: Michirou Yoshino, Osaka (JP); Kojiro Nakamura, Osaka (JP); Toru Furushige, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 202 days.

(21) Appl. No.: 14/054,829

(22) Filed: Oct. 16, 2013

(65) Prior Publication Data

US 2014/0130986 A1      May 15, 2014

(30) Foreign Application Priority Data

Nov. 9, 2012  (JP) ................ 2012-247498

(51) Int. Cl.
*B32B 38/10*     (2006.01)
*H01L 21/67*     (2006.01)
*B32B 43/00*     (2006.01)

(52) U.S. Cl.
CPC ........ *H01L 21/67057* (2013.01); *B32B 43/006* (2013.01); *H01L 21/67092* (2013.01); *Y10T 156/1111* (2015.01); *Y10T 156/1126* (2015.01); *Y10T 156/1153* (2015.01); *Y10T 156/1911* (2015.01); *Y10T 156/1933* (2015.01)

(58) Field of Classification Search
CPC ............ B32B 43/006; H01L 21/67057; H01L 21/67092; Y10T 156/1111; Y10T 156/1126; Y10T 156/1153; Y10T 156/1911; Y10T 156/1933
See application file for complete search history.

(56) References Cited

U.S. PATENT DOCUMENTS

2002/0166569 A1* 11/2002 Harvey et al. ................. 134/1.3
2013/0319619 A1* 12/2013 Matsuno et al. ............. 156/711
2014/0150826 A1*  6/2014 Albrecht et al. ............. 134/25.5

FOREIGN PATENT DOCUMENTS

| GB | 2465591 | 5/2010 |
|----|---------|--------|
| JP | 02-180565 | 7/1990 |
| JP | 11-111652 | 4/1999 |
| JP | 2007-227659 | 9/2007 |
| JP | 3149712 U | 3/2009 |
| JP | 2011-061121 | 3/2011 |
| JP | 2011-077392 | 4/2011 |
| JP | 2011-187499 | 9/2011 |

* cited by examiner

*Primary Examiner* — Mark A Osele
(74) *Attorney, Agent, or Firm* — Panasonic Patent Center

(57) ABSTRACT

A wafer separating apparatus can separate a plurality of wafers bonded to a slicing base with an adhesive from the slicing base. The apparatus includes: a water tank configured to store therein water; a retainer configured to retain the slicing base; a first nozzle configured to apply a jet of water to side of a wafer of the wafers; and a tray configured to contain a wafer separated from the slicing base, wherein the tray is disposed inside the water tank.

7 Claims, 8 Drawing Sheets

WAFER SEPARATING APPARATUS AND WAFER SEPARATING METHOD

CROSS REFERENCE TO RELATED APPLICATIONS

The present application claims the benefit of foreign priority to Japanese Patent Application No. 2012-247493 filed on Nov. 9, 2012, the contents of which are incorporated herein by reference.

BACKGROUND

1. Technical Field

The technical field relates to a wafer separating apparatus for separating wafers bonded to a slicing base with an adhesive and a wafer separating method.

2. Background Art

Wafers, such as silicon wafers, are obtained by slicing a bulk material called an ingot into wafer slices. For obtaining wafers, an ingot is first fixed to a support material called a slicing base through an adhesive. The ingot fixed to the slicing base is sliced using a wire saw into wafers. Then, the wafers are separated from the slicing base to obtain individual wafers.

As shown in FIG. 1A, for separating wafers 60 from a slicing base 50, the slicing base 50 having the wafers 60 bonded thereto is immersed in water 15 to soften an adhesive 63 which fixes the wafers 60 to the slicing base 50. Thus, the wafers 60 are separated from the slicing base 50. The separated wafers 60 fall into a tray 40.

In another method, for separating wafers from a slicing base, applying hot air to an adhesive which bonds the wafers has been described (Japanese Utility Model Registration No. 3149712).

SUMMARY

However, as shown in FIG. 1B, when the wafers 60 separated from the slicing base 50 fall into the tray 40, it is likely that the falling wafers 60 collide with each other or are randomly stacked on one another, so that the wafers 60 are fractured (see character X) or broken (see character Y). Further, a residue 63' of the adhesive is mixed into the water. For this reason, as shown in FIG. 1C, the wafers 60 in the tray 40 need to be cleaned with a cleaning liquid 15'. Furthermore, the wafers 60 which have fallen are randomly contained in the tray 40, and therefore, as shown in FIG. 1D, a step for rearranging the wafers 60 in an orderly row is needed. Thus, the above methods require removing the fractured wafer or broken pieces of wafer or an adhesive residue by a manual operation and rearranging the randomly recovered wafers in an orderly row.

Further, when hot air is applied to the adhesive to dissolve the adhesive as described in Japanese Utility Model Registration No. 3149712, the resultant contaminants stick to the wafers and are difficult to remove.

Accordingly, an object, of this disclosure is to facilitate separation of the wafers from the slicing base and to cause the process of separation of the wafers through the subsequent step without requiring manual operation, thereby enabling the process to be automated.

Specifically, present embodiments are directed to a wafer separating apparatus and a wafer separating method described below.

A wafer separating apparatus, according to various embodiments, can separate a plurality of wafers bonded to a slicing base with an adhesive from the slicing base. The wafer separating apparatus includes: a water tank configured to store therein water; a retainer configured to retain the slicing base having the wafers bonded thereto when the wafers are immersed in water in the water tank; a first nozzle configured to apply a jet of water to a side of a wafer of the wafers immersed in the water in the wafer tank; and a tray configured to contain a wafer separated from the slicing base, wherein, the tray is disposed inside the water tank.

A wafer separating method, according to various embodiment, can separate a plurality of wafers bonded to a slicing base with an adhesive from the slicing base. The method comprises: providing a slicing base having a plurality of wafers bonded thereto with an adhesive; immersing the wafers bonded to the slicing base in water in a water tank; applying a jet of water to a side of a wafer of the wafers immersed in the water in the water tank; and receiving the wafer separated from the slicing base in a tray disposed inside the water tank.

By the use of the wafer separating apparatus of the embodiment, not only can wafers be easily separated from the slicing base, but also the separated wafers can be arranged in an orderly row in the tray, so that the process of separation of the wafers through the subsequent step can be automated without manual operation.

DETAILED DESCRIPTION

Figure 1A:
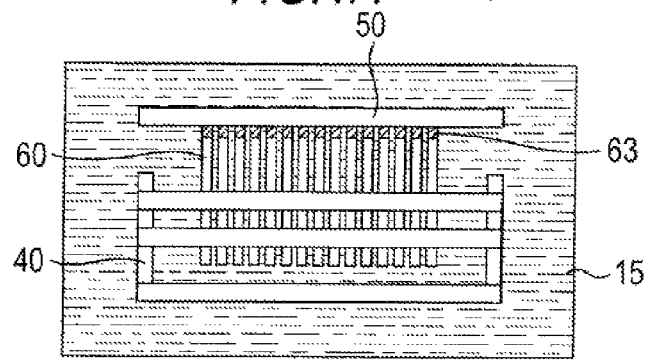
FIGS. 1A to 1D are views diagrammatically showing a conventional wafer separating apparatus.
Figure 1B:
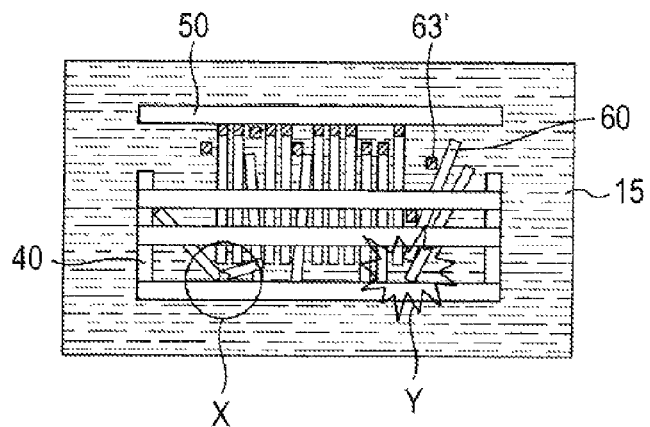
Figure 1C:
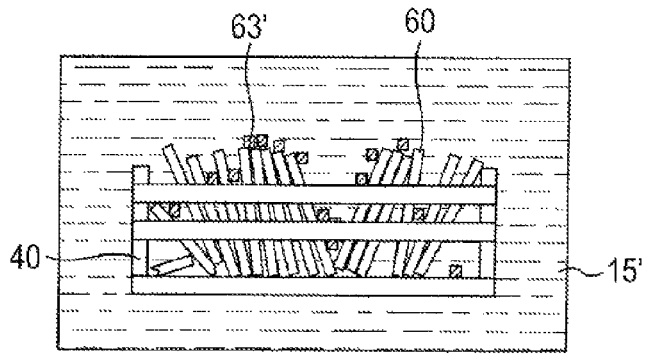
Figure 1D:
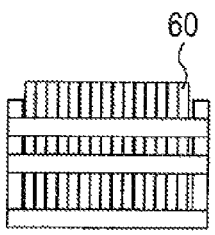

Reference will now be made in detail to the accompanying drawings. Wherever possible, the same reference numerals will be used throughout the drawings to refer to the same or like parts. It should be understood that the user of relational terms such as first and second are used solely to distinguish one from another entity, item, or action without necessarily requiring or implying any actual such relationship or order between such entities, items or actions.

A wafer separating method of the present embodiment can be one step in a method for producing a wafer. An exemplary flow of the method for producing a wafer is shown in FIGS. 2A-2G.

Figure 2A:
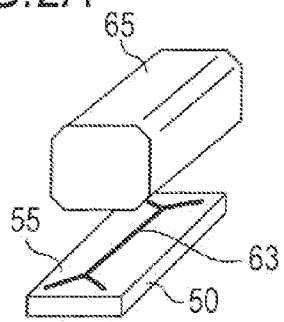
FIGS. 2A to 2G are views showing a process for obtaining a slicing base having a plurality of wafers bonded thereto.
Figure 2B:
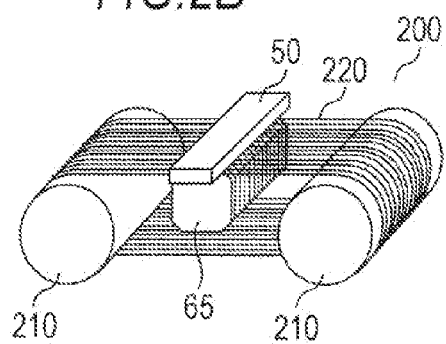

A semiconductor bulk material called an ingot 65 is bonded to a slicing base with an adhesive 63 (see FIG. 2A). The ingot bonded with the adhesive 63 is sliced into a plurality of wafers (FIG. 2B). The sliced wafers bonded, to the slicing base are cleaned (FIG. 2C) to thereby obtain the slicing base 50 having the wafers 60 bonded thereto.

The adhesive 63 for bonding the ingot 65 to the slicing base 50 is preferably a one-component adhesive or a two-component adhesive, and can be, for example, an epoxy adhesive. With respect to the material for the slicing base 50, there is no particular limitation, and the material for the slicing base may be a conductive material, such as a carbon material, an insulating inorganic material, such as glass, or an organic material, such as an epoxy resin. The slicing base 50 may be constructed of a porous material. Examples of materials constituting the porous material include a carbon material. The ingot can be strongly bonded to the wafer bonded surface of the slicing base 50 made of a porous material due to an anchor effect. Therefore, the bond strength between the slicing base 50 and the adhesive 63 is stronger than the bond strength between, the ingot 65 and the adhesive 63. Consequently, when the wafers 60 obtained by slicing the ingot 65 are separated from, the slicing base, the adhesive 63 remains on the slicing base 50 and is advantageously unlikely to transfer to the wafers 60.

As shown in FIG. 2B, the ingot 65 bonded to the slicing base 50 is cut into slices by a cutting apparatus, such as a wire saw 200 having a pair of main rollers 210 and a wire 220 wound round the main rollers 210, to obtain a plurality of wafers 60. The ingot 65 is cut into slices and, on the other hand, the slicing base 50 is not cut into slices (grooves may be formed in the slicing base in the thickness direction). Examples of wire saws as a cutting apparatus include a multi-wire saw and a wire electric discharge machine.

Figure 2C:
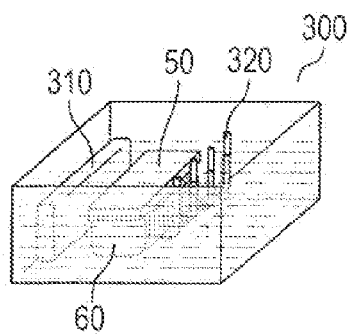

As shown in FIG. 2C, a plurality of wafers 60 fixed to the slicing base 50 are cleaned with water in the water tank 300. The wafers 60 are immersed in the water, together with the slicing base 50, and ultrasonic waves may be applied to the wafers 60 (by ultrasonic unit 310), or a jet of water may be applied to the wafers 60 (by jet nozzle 320).

Figure 2D:
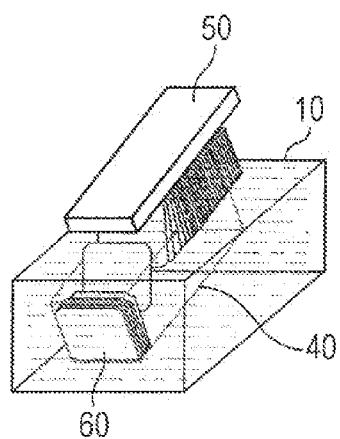

Next, as shown in FIG. 2D, using the wafer separating method of the embodiment, the wafers 60 are separated from the slicing base 50 having the wafers 60 bonded thereto.

The wafer separating method of the embodiment is described in detail later, but can be conducted using a wafer separating apparatus (see numeral 100 in FIG. 3A and numeral 100' in FIG. 3B). The wafer separating apparatus has a water tank 10 configured to store therein water; a retainer 20 for retaining a slicing base 50 having a plurality of wafers 60 bonded thereto through an adhesive 63 so that at least a part of the wafers is immersed in water in the water tank; a first nozzle 30 configured to apply a jet of water to a side of a wafer of the wafers immersed in the water in the water tank; and a tray 40 configured to contain a wafer separated from the slicing base, wherein the tray 40 is disposed inside the water tank. By the wafer separating method of the embodiment, the tray 40 containing a plurality of wafers 60 separated from the slicing base 50 is obtained.

Figure 2E:
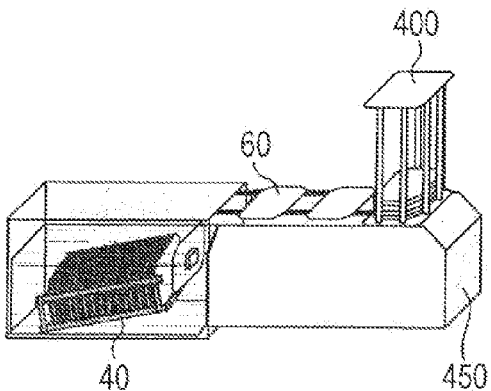

Next, as shown in FIG. 2E, the wafers 60 contained in the tray 40 are removed therefrom and placed in a cassette 400. For removing the wafers 60 contained in the tray 40 and placing them in the cassette 400, the wafers 60 are removed from, the tray 40 one by one and transported to the cassette by a separating apparatus (separator) 450. In the wafer separating method of the embodiment, a plurality of wafers are arranged in an orderly row in the tray, and therefore in process from the separation step through the step for placing the wafers in the cassette no manual operation, is required (operation of arranging the wafers in an orderly row by an operator). The step for removing the wafers 60 from the tray 40 is described in detail later.

Figure 2F:
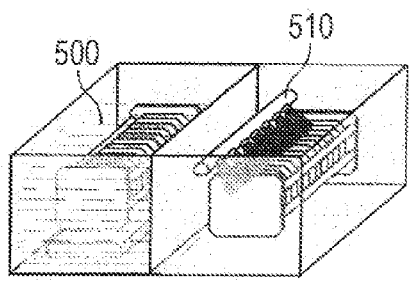
Figure 2G:
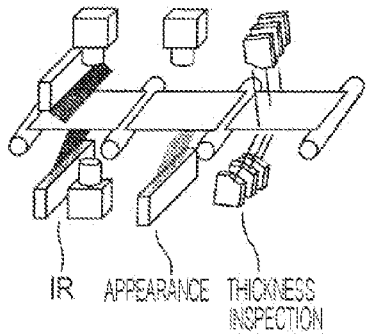

Further, as shown in FIG. 2F, the wafers 60 placed in the cassette 400 are cleaned in pure water 500, together with the cassette 400, and then dried using a hot-air dryer 510 or the like. Ultrasonic waves may be applied to the waiters 60 in the pure water. Then, as shown in FIG. 2G, the wafers 60 are individually inspected. The inspection includes IR measurement, appearance inspection, and thickness measurement.

2. With Respect to the Wafer Separating Method

The above-mentioned wafer separating method is a method for separating a plurality of wafers fixed to a slicing base, using a wafer separating apparatus, from the slicing base (see FIG. 2D). The wafer separating method comprises the steps of: (1) immersing at least a part of the wafers bonded to the slicing base with an adhesive in water stored in a wafer tank; (2) applying a jet of water to the sides of the wafers immersed in the water in the water tank; and (3) receiving the wafers separated from the slicing base in a tray disposed inside the water tank.

Figure 3A:
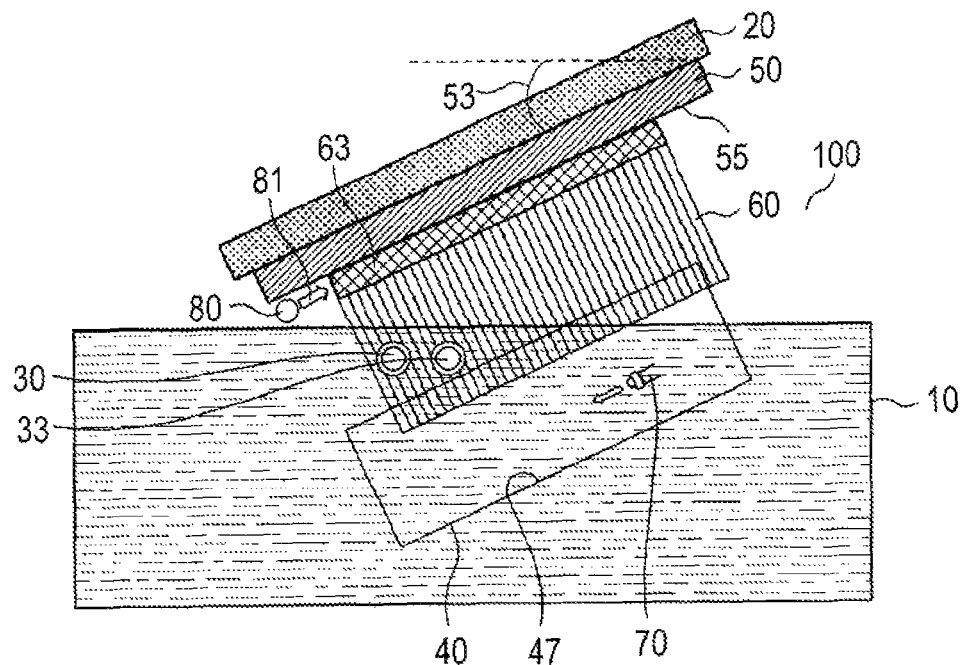
FIG. 3A is a view diagrammatically showing the wafer separating apparatus according to a first exemplary embodiment.
Figure 3B:
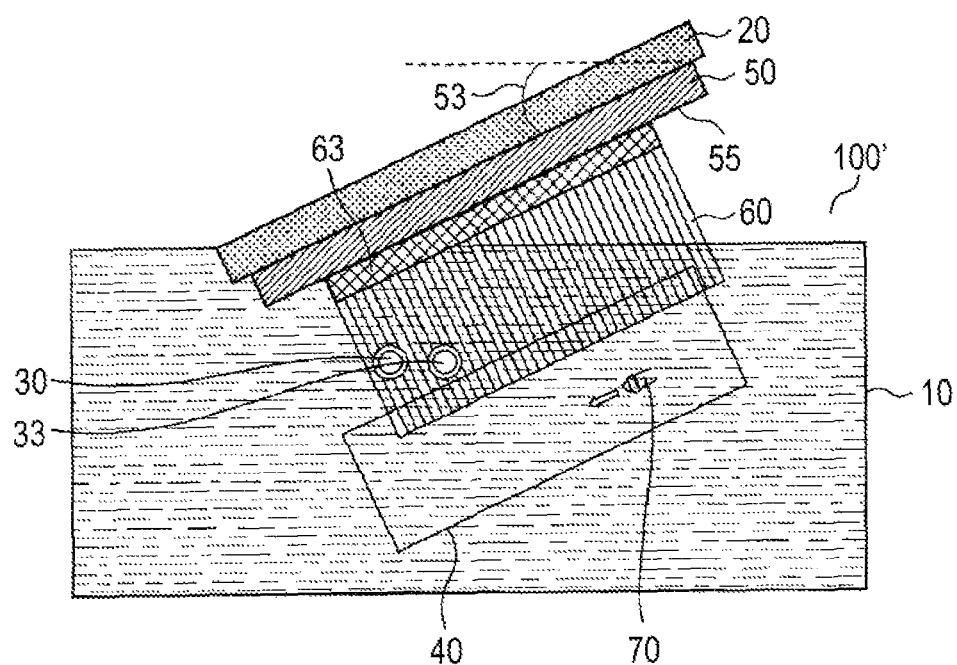
FIG. 3E is a view diagrammatically showing the wafer separating apparatus according to a second exemplary embodiment.

The wafer separating method includes the first embodiment in which, in the step (1), the adhesive which bonds the wafers to the slicing base is not immersed in water in the water tank and only the wafers are immersed in water (see FIG. 3A), and the second embodiment in which, in the step (1), the wafers as well, as the adhesive which bonds the wafers to the slicing base are immersed in water in the water tank (see FIG. 3B). The embodiments are individually described below.

In the separating method according to the first embodiment, the adhesive 63 which bonds the wafers 60 to the slicing base 50 is not immersed in water in the water tank 10 and only the wafers 60 are immersed in water (FIG. 3A). The separating method according to the first embodiment can be conducted using a wafer separating apparatus 100.

The wafer separating apparatus 100 has a water tank 10 configured to store therein water; a retainer 20 configured to retain a slicing base 50 having a plurality of wafers 60 bonded thereto through an adhesive 63 so that a part of the wafers is immersed in water in the water tank; a first nozzle 30 configured to apply, to a side of the wafer immersed in the water in the water tank, a jet of water from the water in the water tank; a tray 40 configured to contain the wafer separated from the slicing base, wherein the tray 40 is disposed inside the water tank; and a steam nozzle 80 configured to apply steam to the adhesive 63 which bonds the wafers 60 to the slicing base 50.

The water tank 10 can store therein water or water containing a chemical substance (aqueous solution). In the first embodiment, it is preferred that the water tank 10 stores therein water.

The retainer 20 retains the slicing base 50 having the wafers 60 bonded thereto. The slicing base 50 retained by the retainer 20 is a plate-form member for fixing thereto the wafers 60.

The wafers 60 bonded to the slicing base 50 are generally semiconductor wafers, preferably silicon wafers. The wafers 60 are bonded to the wafer bonded surface of the slicing base 50 through an adhesive. Further, the wafers 60 fixed to the slicing base 50 are arranged so that the principal surfaces of the individual wafers are parallel to each other.

As shown in FIG. 3h, the retainer 20 can immerse at least parts of the wafers 60 bonded to the slicing base 50 in water in the water tank 10, but, in the first embodiment, the retainer immerses the wafers in the water in the water tank but does not immerse the adhesive 63, which bonds the wafers to the slicing base 50, in the water.

It is preferred, that the retainer 20 retains the slicing base 50 so that the wafer bonded surface 55 of the slicing base 50 slopes at an angle to the surface of the water in the water-tank 10. Specifically the direction of the arranged wafers 60 slopes at the angle to the surface of the wafer in the water tank 10. More specifically, it is preferred that the retainer 20 retains the slicing base 50 so that the wafer to be first separated (see FIGS. 3A and 4) is located in the undermost position of the arranged wafers. An angle 53 of the slope of the slicing base is preferably 5 to 45°, for example, 25°.

The first nozzle 30 applies a jet of water to the sides of the wafers 60 which are bonded to the slicing base 50 retained by the retainer 20 and which are immersed in the water. The water applied in the jet can be water stored in the water tank 10. The jet of water causes gaps between the wafers 60 bonded to the slicing base 50 (or enlarges the gaps). It is preferred that the direction of the jet of water applied by the first nozzle 30 is parallel to the wafer bonded surface 55 of the slicing base 50 or parallel to the surface of the water in the water tank 10. When the direction of the jet of water applied by the first nozzle 30 is perpendicular to the wafer bonded surface 55 of the slicing base 50, gaps can be caused between the wafers, but the gaps are not stabilized, making it difficult to control the direction of the wafers to be separated.

It is preferred that the first nozzle 30 applies the jet of water to the side of the wafer to be first separated, namely, the side of the wafer positioned at the end of the wafers 60 arranged in an orderly row. In this case, the wafers 60 can foe separated from the slicing base 50 successively from the wafer positioned at the end.

The wafer separating apparatus 100 may have, in addition to the first nozzle 30, a first auxiliary nozzle 33 configured to apply a jet of water to sides of the wafers 60. The first auxiliary nozzle 33 does not apply a jet of water to the wafer positioned at the end but to the sides of the wafers 60 positioned near, e.g. next to, the wafer at the end. The jet of water applied by the first nozzle 30 and the jet of water applied by the first auxiliary nozzle 33 more efficiently cause gaps between the wafers to be separated (or enlarges the gaps).

The tray 40 is disposed in the water in the water tank 10. The wafers 60 separated from the slicing base 50 are successively received in the tray 40.

Figure 5A:
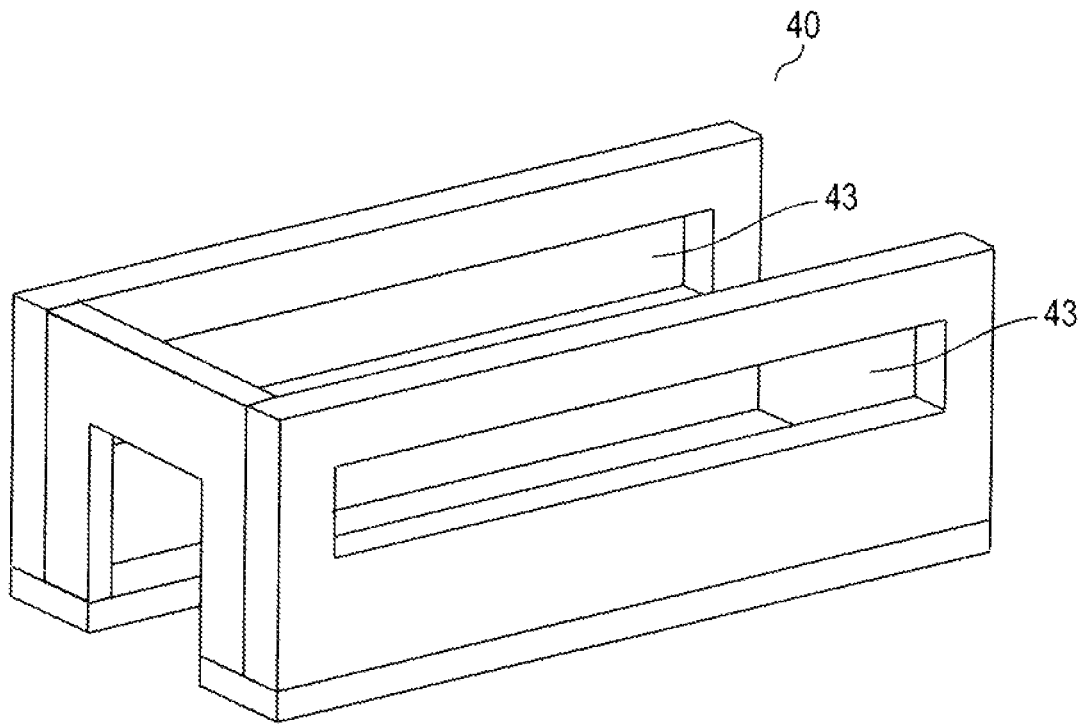
FIG. 5A is a perspective view of the tray.
Figure 5B:
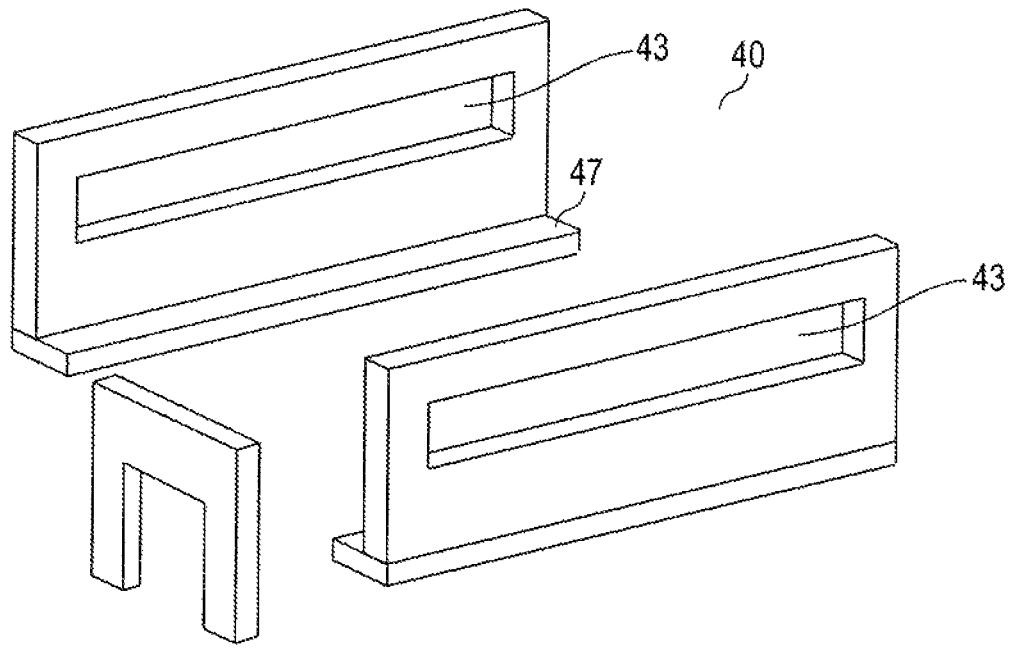
FIG. 5B is an exploded view of the tray.

As shown in FIGS. 5A and 5B, the tray 40 may have an opening. FIG. 5A is a perspective view of the tray 40, and FIG. 5B is an exploded view of the tray 40. It is preferred that the tray 40 has openings 43 through which the jet of water caused by the first nozzle 30 passes. The openings reduce the fluid resistance of the jet.

As shown in FIG. 3A, it is preferred, that a receiving surface 47 of the tray 40 (bottom of the receiving portion of the tray 40) is arranged parallel to the wafer bonded surface 55 of the slicing base 50. In other words, when the slicing base 50 is retained so that it slopes at an angle to the surface of the water in the water tank 10, it is preferred that the tray 40 is arranged so that if also slopes.

The wafer separating apparatus 100 may further have, in the water tank 10, a second nozzle 70 configured to apply a jet of water to the principal surface of the wafer separated from the slicing base 50'. The jet of water applied by the second nozzle 70 not only introduces the separated wafers 60 into the tray 40 but also keeps the wafers contained in the tray 40.

The separating apparatus 100 (see FIG. 3A) further has a steam nozzle 80. The steam nozzle 80 applies steam to the adhesive 63 which bonds the wafers 60 to the slicing base 50 to soften the adhesive 63. The adhesive 63 is softened, and further the jet of water applied by the first nozzle 30 causes gaps between the wafers 60 bonded to the slicing base 50, so that the wafers 60 are separated from the slicing base 50. Further, the steam applied is not high temperature dried gas but steam, gas, and therefore drying of the wafer is suppressed, preventing contaminants from sticking to the wafers.

That is, the steam nozzle 80 applies steam to the adhesive 63 which bonds the wafers to which the first nozzle 30 applies the jet of water. The steam nozzle 80 applies to the adhesive 63 steam in the direction indicated by an arrow 81 shown in FIG. 3A, and may further apply to the adhesive 63 steam in the direction perpendicular to the plane of the paper of FIG. 3A upwardly or downwardly.

Figure 4:
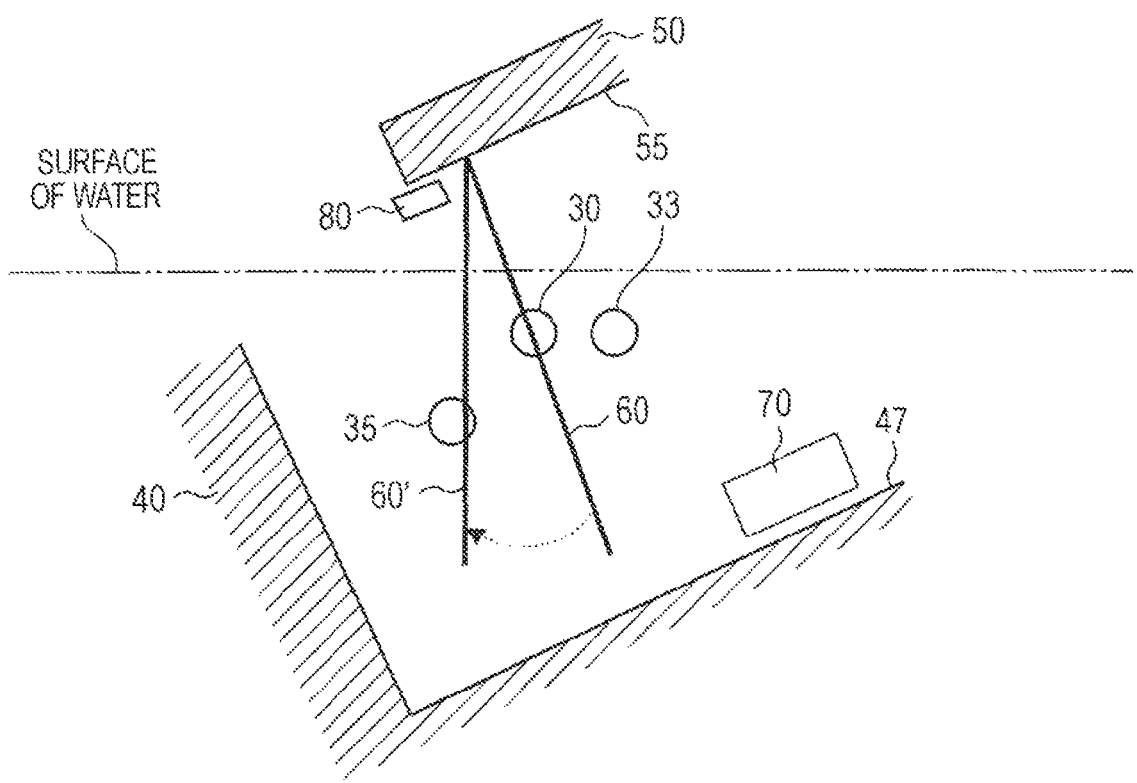
FIG. 4 is a diagrammatic view showing the positional relationship between the slicing base, first nozzle, first auxiliary nozzle, tray, second nozzle, and steam nozzle.

FIG. 4 shows an example of the positional relationship between the slicing base 50, first nozzle 30, first auxiliary nozzle 33, tray 40, second nozzle 70, steam nozzle 80, and third nozzle 35 (not shown in FIG. 3A).

As shown in FIG. 4, the slicing base 50 is arranged, so that the wafer bonded surface 55 slopes at an angle to the surface of the water. The tray 40 is arranged so that the wafer bonded surface 55 is parallel to the receiving surface 47 of the tray 40. The steam nozzle 80 can apply steam to the adhesive which bonds the wafer positioned at the end of the wafers bonded to the slicing base 50. Further, the second nozzle 70 is constructed so as to cause the jet of water parallel to the plane direction of the receiving surface 47.

The first nozzle 30 is arranged so as to apply the jet of water to the side of the wafer positioned at the end of the wafers 60 bonded to the slicing base 50. Further, the first auxiliary nozzle 33 is arranged so as to apply the jet of water to the sides of the other wafers positioned near the wafer at the end. The third nozzle 35 is arranged so as to apply a jet of water to a side of a wafer 60' when a wafer at the end of wafers 60 has tilted to become the wafer 60' in the vertical direction. The jet of water applied by the third nozzle 35 keeps the wafer 60' in a prescribed direction.

Figure 6A:
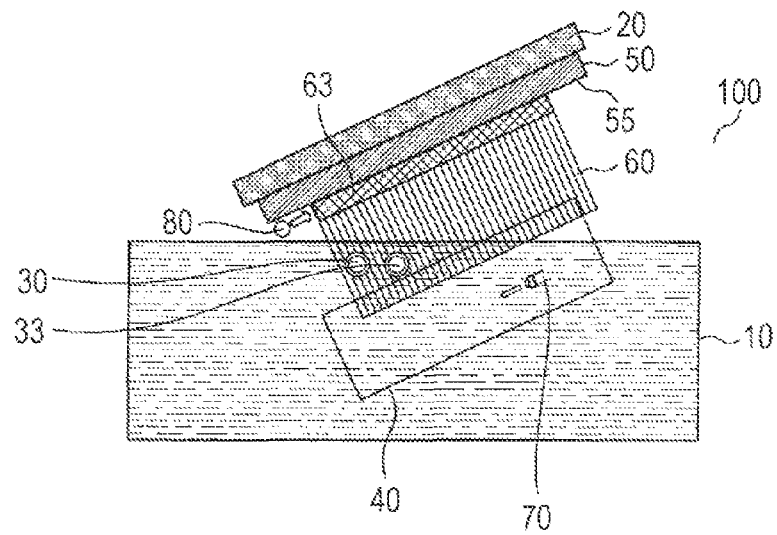
FIGS. 6A to 6D are views showing a flow of the wafer separating method according to a first exemplary embodiment.

FIGS. 6A to 6D show a flow of the wafer separating method, according to the first embodiment. As shown in FIG. 6A, in the same manner as in FIG. 3A, the retainer 20 retains the slicing base 50 so that a part of the wafers 60 is immersed in water in the water tank 10.

Figure 6B:
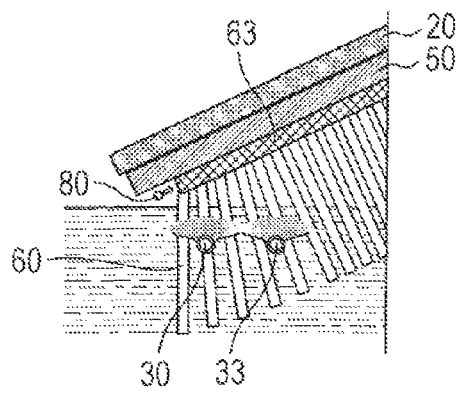

As shown in FIG. 6B, the steam nozzle 80 applies steam to the adhesive 63 which bonds the wafer positioned at the end of the arranged wafers 60, and further the first nozzle 30 applies the jet of water to the side of the wafer positioned at the end of the arranged wafers 60. Similarly, the first auxiliary nozzle 33 applies the jet of water to the sides of other wafers in the wafers 60. These jets of wafer cause gaps between the wafers 60. In this case, it is preferred that the wafer positioned at the end of the arranged wafers 60 points in the vertical direction.

With respect to the amount of water discharged from each of the first nozzle 30 and the first auxiliary nozzle 33, for example, each amount is 1.4 to 1.6 L/minute.

Figure 6C:
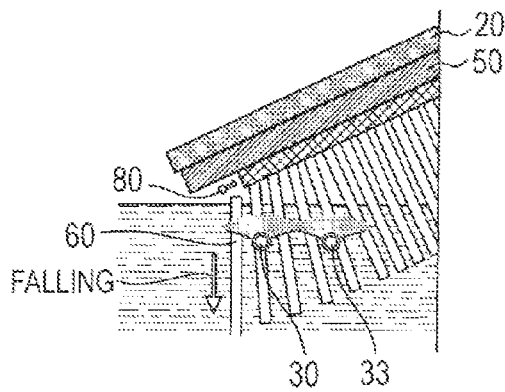

The steam nozzle 80 applies steam to the adhesive 63, and further the first nozzle 30 applies the jet of water to the side of the wafer, so that, as shown in FIG. 6C, the wafer positioned at the end of the wafers 60 is separated, from the slicing base 50 and falls through the water. The second nozzle 70 applies the jet of wafer to the principal surface of the falling wafer, so that the wafer is introduced to and contained in the tray 40 (see FIG. 6D).

Figure 6D:
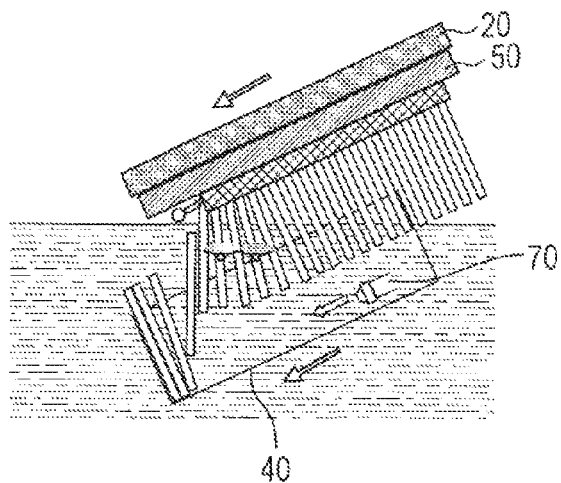

Further, as shown in FIG. 6D, the wafers 60 remaining on the slicing base 50 are successively separated from the slicing base 50. The falling wafers 60 are introduced into the tray 40 by the jet of water applied by the second nozzle 70 and arranged in the orderly row. The above-mentioned operation is repeated to arrange all the wafers 60 in the orderly row in the fray 40.

The slicing base 50 may be moved while separating the wafers 60 from, the slicing base 50 successively. Specifically, it is preferred that the slicing base 50 is moved so that the jet of water applied by the first nozzle 30 is positioned around the side of the wafer to be separated. In other words, it is preferred that the slicing base 50 is allowed to slowly sink through the water in the direction of the arranged wafers 60.

Further, the tray 40 may be moved while separating the wafers 60 from the slicing base 50 successively. Specifically, it is preferred that the tray 40 is moved so as to be synchronized with the movement of the slicing base 50 (in the same direction as the direction of movement of the slicing base 50). In this case, the relative position between the wafer to be separated and the position of the tray 40 for receiving the wafer can be kept constant. It is preferred that the movement of the tray 40 is smaller than the movement of the slicing base 50. In this case, gaps are present between the wafers 60 bonded on the slicing base 50 but the fallen wafers 60 can be arranged in an orderly row without any gap in the tray 40.

In the separating method according to the second embodiment, the wafers 60 as well as the adhesive 63 which bonds the wafers 60 to the slicing base 50 are immersed in water in the water tank 10 (FIG. 3B). The separating method according to the second embodiment can be conducted using a wafer separating apparatus 100'.

Like the wafer separating apparatus 100 (see FIG. 3A), the wafer separating apparatus 100' has a water tank 10 configured to store therein water; a retainer 20 configured to retain the slicing base 50 having a plurality of wafers 60 bonded thereto through an adhesive 63 so that the wafers 60 are immersed in water in the water tank; a first nozzle 30 configured to apply, to a side of a wafer of the wafers immersed in the water in the water tank, a jet of water from the water stored in the water tank; and a tray 40 configured to contain the wafer separated from the slicing base 50, wherein the tray 40 is disposed inside the water tank.

In the wafer separating apparatus 100', it is preferred that the water stored in the water tank 10 contains a chemical substance capable of dissolving the adhesive 63. Examples of chemical substances capable of dissolving the adhesive 63 include lactic acid. In addition, in the wafer separating apparatus 100', the water stored in the water tank 10 may be warm water.

The wafer separating apparatus 100' has substantially the same construction as that of the wafer separating apparatus 100 except that 1) the retainer 20 immerses both the wafers 60 and the adhesive 63, which bonds the wafers 60 to the slicing base 50, in the water in the water tank 10, that 2) the apparatus may have no steam nozzle 80, and that 3) the water in the water tank 10 contains the chemical substance.

Figure 7A:
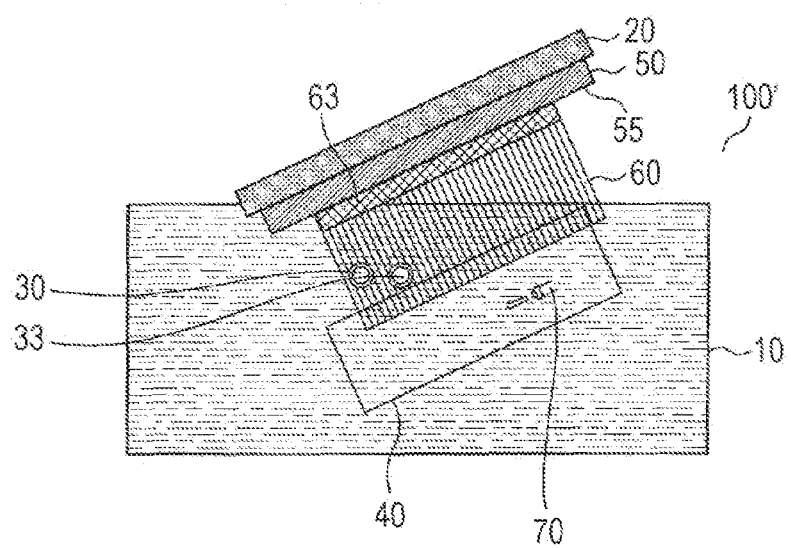
FIGS. 7A to 7D are views showing a flow of the wafer separating method according to a second exemplary embodiment.

FIGS. 7A to 7D show a flow of the wafer separating method according to the second embodiment. As shown in FIG. 7A, the retainer 20 retains the slicing base 50 so that both the wafers 60 and the adhesive 63 which bonds the wafers 60 are immersed in the water in the water tank 10. The water containing a chemical substance dissolves the adhesive 63 to lower the bonding force of the wafers 60 to the slicing base 50.

Figure 7B:
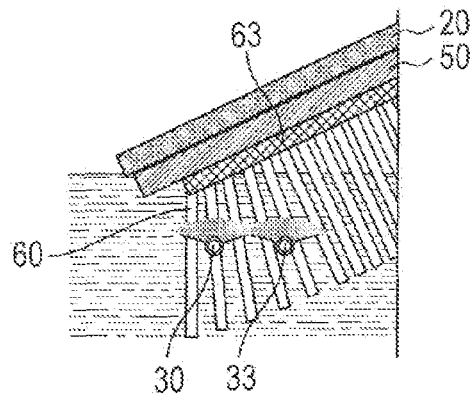

Then, as shown in FIG. 7B, like the first embodiment (see FIG. 6B), a jet of water applied by the first nozzle 30 and, if necessary, a jet of water applied by the first auxiliary nozzle 33 cause gaps between the wafers 60. With respect to the amount of water discharged from each of the first nozzle 30 and the first auxiliary nozzle 33, for example, each amount is 1.4 to 1.6 L/minute.

Figure 7C:
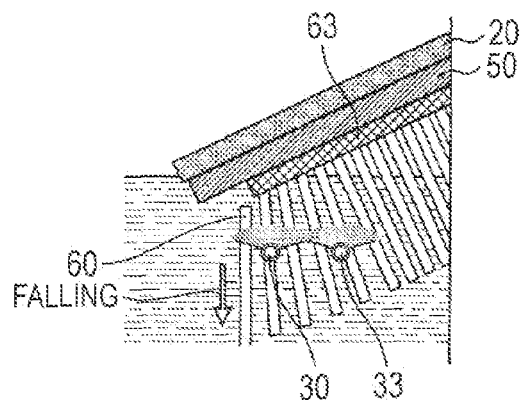

As a result, as shown in FIG. 7C, the adhesive 63 is dissolved, and further gaps are caused between the wafers 60, so that the wafer positioned at the end of the wafers 60 is separated from the slicing base 50 and falls through the water.

Figure 7D:
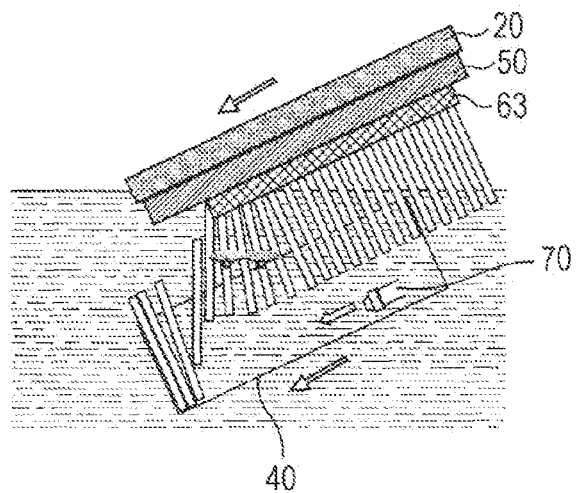

As shown in FIG. 7D, the second nozzle 70 applies the jet of water to the principal surfaces of the falling wafers 60, so that the falling wafers 60 are introduced to and received in the tray 40. Further, like the first embodiment, all the wafers 60 are arranged in the orderly row in the tray 40. Like the first embodiment, the slicing base 50 and tray 40 may be moved.

Figure 8:
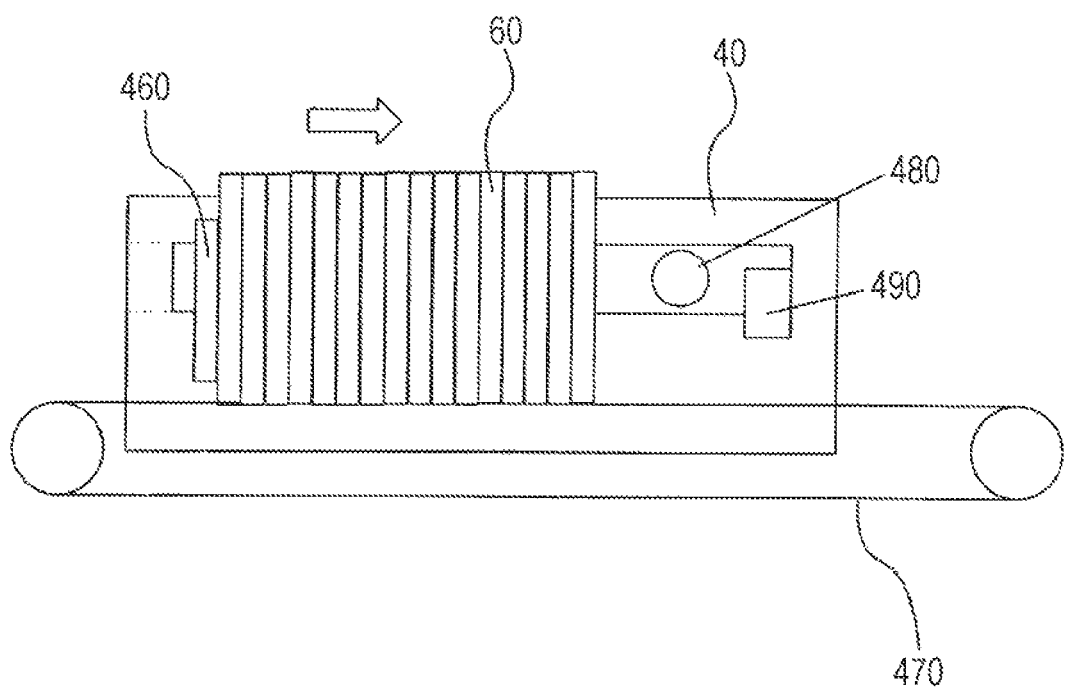
FIG. 8 is a view showing an exemplary embodiment for removing the wafers one by one from the tray containing the wafers therein.

A method for placing the wafers in a cassette according to an exemplary embodiment will be discussed. A plurality of wafers 60 arranged in an orderly row in the tray 40 are removed from the fray 40 and placed in a cassette 400 (see FIG. 2E). FIG. 8 shows an exemplary embodiment for removing the wafers 60 one by one (wafer by wafer) from the tray 40 containing the wafers therein. Specifically, a conveyer 470 feeds the wafers 60. A back plate 460 (which is fixed to the conveyer 470 or synchronized with the conveyer 470) holds the wafers so that the wafers do not fall down. A jet nozzle 480 applies a jet of water to the wafers 60 to cause gaps between the wafers 60. An adsorption pad 490 adsorbs the wafers one by one, wherein the wafers have gaps therebetween. Thus, the wafers 60 can be removed one by one and placed in the cassette 400.

As described hereinabove, by the present embodiments, the process of separation of the wafers through the subsequent step (for example, a step for placing the wafers in a cassette) in the method for producing a wafer can be automated without a manual operation.

Among the above-mentioned various embodiments and modified examples, arbitrary embodiments or modified examples can be appropriately selected and combined to achieve their respective effects.

What is claimed is:

1. A wafer separating apparatus for separating a plurality of wafers bonded to a slicing base with an adhesive from the slicing base, the wafer separating apparatus comprising:
   a water tank configured to store therein water;
   a retainer configured to retain the slicing base having the wafers bonded thereto so that the wafers are immersed in water in the water tank;
   a first nozzle configured to apply a jet of water to a side of a wafer among the wafers immersed in the water in the water tank; and
   a tray configured to receive a wafer separated from the slicing base, the tray being disposed inside the water tank,
   wherein the retainer is configured to retain the slicing base so that a wafer bonded surface of the slicing base slopes at an angle to a surface of the water in the water tank, along an arrangement direction of the plurality of wafers,
   the slicing base is configured to slowly sink into the water in the arrangement direction of the plurality of wafers, and
   the tray is configured to move so as to be synchronized with a movement of the slicing base in an identical direction as a direction of the movement of the slicing base.

2. The wafer separating apparatus according to claim 1, further comprising a steam nozzle configured to apply steam to the adhesive bonding the wafers immersed in the water to the slicing base.

3. The wafer separating apparatus according to claim 1, further comprising a second nozzle configured to apply a jet of water to a principal surface of the wafer separated from the slicing base.

4. The wafer separating apparatus according to claim 1, wherein the water stored in the water tank contains lactic acid, and wherein the retainer is configured to retain the slicing base so that the adhesive which bonds the wafers to the slicing base is immersed in the water in the water tank.

5. The wafer separating apparatus according to claim 1, wherein the slicing base is constructed of a porous material.

6. The wafer separating apparatus according to claim 1, wherein a movement of the tray is smaller than the movement of the slicing base.

7. A wafer separating method for separating a plurality of wafers bonded to a slicing base with an adhesive from the slicing base, the method comprising:
provide a slicing base having a plurality of wafers bonded thereto with an adhesive;
retaining the slicing base so that a wafer bonded surface of the slicing base slopes at an angle to a surface of water in a water tank, along an arrangement direction of the plurality of wafers,
immersing at least one of the wafers bonded to the slicing base in the water in the water tank;
slowly sinking the slicing base into the water in the arrangement direction of the plurality of wafers,
applying a jet of water to a side of a wafer of the wafers immersed in the water in the water tank; and
receiving a wafer separated from the slicing base in a tray disposed inside the water tank and configured to move so as to be synchronized with a movement of the slicing base in an identical direction as a direction of the movement of the slicing base.

* * * * *